US012660598B2

(12) United States Patent
  Guler et al.

(10) Patent No.: US 12,660,598 B2
(45) Date of Patent: Jun. 16, 2026

(54) RECESSED AND SELF-ALIGNED BURIED POWER RAIL

(71) Applicant: Intel Corporation, Santa Clara, CA (US)

(72) Inventors: Leonard P. Guler, Hillsboro, OR (US); Jeffrey S. Leib, Beaverton, OR (US); Chanaka D. Munasinghe, Portland, OR (US); Charles H. Wallace, Portland, OR (US); Tahir Ghani, Portland, OR (US); Mohit K. Haran, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 384 days.

(21) Appl. No.: 17/561,717

(22) Filed: Dec. 24, 2021

(65) Prior Publication Data

US 2023/0207466 A1     Jun. 29, 2023

(51) Int. Cl.
  *H10W 20/41*     (2026.01)
  *H10D 30/62*     (2025.01)
  *H10D 30/67*     (2025.01)
  *H10D 62/10*     (2025.01)

(52) U.S. Cl.
  CPC .......... *H10W 20/427* (2026.01); *H10D 30/62* (2025.01); *H10D 30/6735* (2025.01); *H10D 62/118* (2025.01)

(58) Field of Classification Search
  CPC ............... H01L 23/5286; H10D 30/62; H10D 30/6735; H10D 62/118; H10D 84/0149; H10D 84/0158; H10D 84/038; H10D 84/83; H10D 84/834; H10D 30/024; H10D 30/6757; H10D 62/121; H10D 64/017; H10D 84/0128; H10D 84/013; H10W 20/427; H10W 20/076; H10W 20/069; H10W 20/0698; H10W 20/20; H10W 20/43; H10W 20/40; H10W 20/484; H10W 20/056; H10W 20/425; H10W 20/435
USPC ........................................................ 257/434
See application file for complete search history.

(56) References Cited

U.S. PATENT DOCUMENTS

| 2020/0135634 A1 | 4/2020 | Chiang | |
| 2021/0028112 A1 | 1/2021 | Kim | |
| 2021/0399098 A1 | 12/2021 | Li | |
| 2022/0173039 A1* | 6/2022 | Yang | .................... H10D 84/907 |

OTHER PUBLICATIONS

Search Report from European Patent Application No. 22205985.9, mailed May 31, 2023, 7 pgs.
Office Action from European Patent Application No. 22205985.9, mailed Apr. 1, 2026, 6 pgs.

* cited by examiner

*Primary Examiner* — Monica D Harrison
(74) *Attorney, Agent, or Firm* — Schwabe, Williamson & Wyatt P.C.

(57)     ABSTRACT

Embodiments include semiconductor devices. In an embodiment, a semiconductor device comprises a first non-planar transistor over a substrate and a second non-planar transistor over the substrate and parallel to the first non-planar transistor. In an embodiment, a gate structure is over the first non-planar transistor and the second non-planar transistor. In an embodiment, a power rail is between the first non-planar transistor and the second non-planar transistor. In an embodiment, a top surface of the power rail is below a top surface of a gate structure.

25 Claims, 13 Drawing Sheets

RECESSED AND SELF-ALIGNED BURIED POWER RAIL

TECHNICAL FIELD

Embodiments of the disclosure are in the field of semiconductor structures and processing and, in particular, to self-aligned buried power rails in non-planar transistor architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multigate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
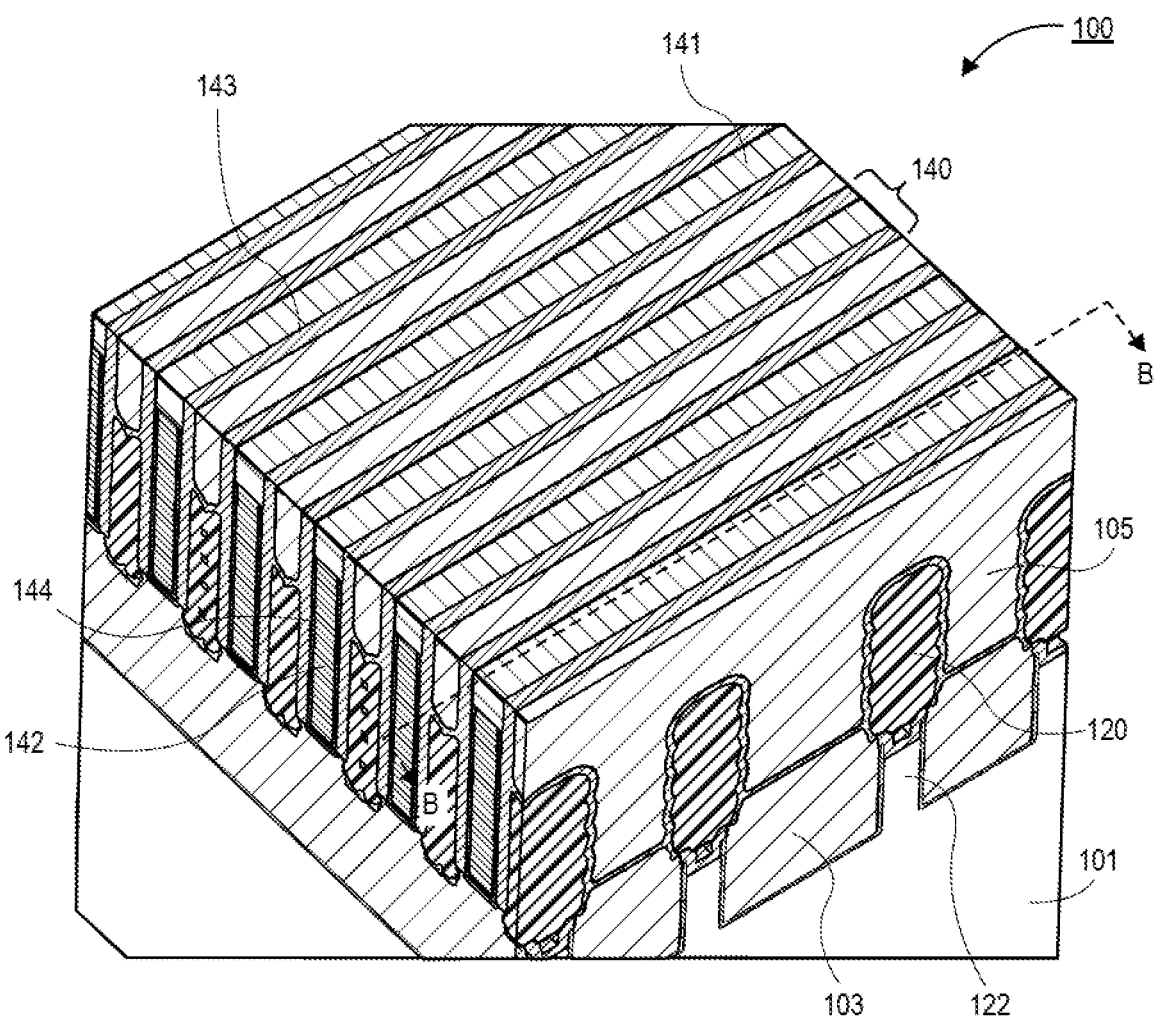
FIG. 1A is a perspective view illustration of a transistor device, in accordance with an embodiment.

Embodiments described herein comprise self-aligned buried power rails in non-planar transistor architectures. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments disclosed herein include transistor devices that utilizes buried power rails to connect source/drain regions to each other. In addition to the buried architecture, the power rails are formed with a self-aligned process. Particularly, the power rails are self-aligned to the source/drain contacts. As such, issues with source/drain contacts and gate electrodes shorting to the power rail are mitigated. This allows for improved scaling, and an increase in the transistor density.

Referring now to FIG. 1A, a perspective view illustration of a semiconductor device 100 is shown, in accordance with an embodiment. In an embodiment, the semiconductor device 100 is fabricated on a semiconductor substrate 101. The semiconductor substrate 101 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, a plurality of transistor devices are fabricated on the semiconductor substrate 101. For example, non-planar transistors that extend up as fin or fin-like structures may be formed on the semiconductor substrate 101. For example, in the view shown in FIG. 1A, a sub-fin 122 extends up from the semiconductor substrate 101. Fins, nanoribbon, or nanowire structures may be provided over the sub-fins 122. Cross-sectional illustrations of the fins and nanoribbon structures are shown in greater detail in FIGS. 1B and 1C below. In an embodiment, an isolation layer 103 (commonly referred to as a shallow trench isolation (STI) layer) is provided around the sub-fins 122. The isolation layer 103 may comprise silicon and oxygen (e.g., $SiO_2$).

In an embodiment, source/drains 120 may be provided over the sub-fins 122 outside of the gate structures 140. While referred to generally as source/drains 120, it is to be appreciated that features 120 may either be a source or a drain, depending on how the transistor devices are electrically connected. In an embodiment, the source/drains 120 may be formed with any suitable process. For example, the portions of the fin adjacent to the gate structure 140 may be recessed. These recesses may then be filled with a silicon alloy using a selective epitaxial deposition process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. The growth of the source/drains 120 may extend out laterally. That is, a width of the source/drains 120 may be greater than a width of the fins. In an embodiment, a dielectric layer may be disposed around the source/drains 120. An insulator 105 may surround the source/drains 120. In an embodiment, the insulator 105 may be the same material as the isolation layer 103.

In an embodiment, the gate structures 140 may be oriented substantially orthogonal to the fins. The gate structures 140 may comprise gate spacers 143. Within the gate spacers 143 are a gate dielectric 144 and a gate metal 142. An insulator 141 may also be provided over the gate metal 142. A more detailed description of the gate structure 140 is provided below in the description of FIGS. 1B and 1C.

In an embodiment, the structure of the semiconductor device 100 may be fabricated with any suitable non-planar transistor assembly process. For example, fins may be formed, and a dummy gate structure (e.g., comprising poly-silicon) may be disposed across the fins. The fins may then be recessed outside of the gate structure 140, and the source/drains may be formed with a process similar to the process described above. The isolation layer 105 may be formed over the source/drains 120. The dummy gate structure may then be replaced with a metal gate structure. For example, a replacement metal gate (RMG) process may be used in order to fabricate the gate structure 140. In the instance of nanoribbon or nanowire transistor devices, the sacrificial layers between the semiconductor channels in the fin may also be removed during the RMG process.

Figure 1B:
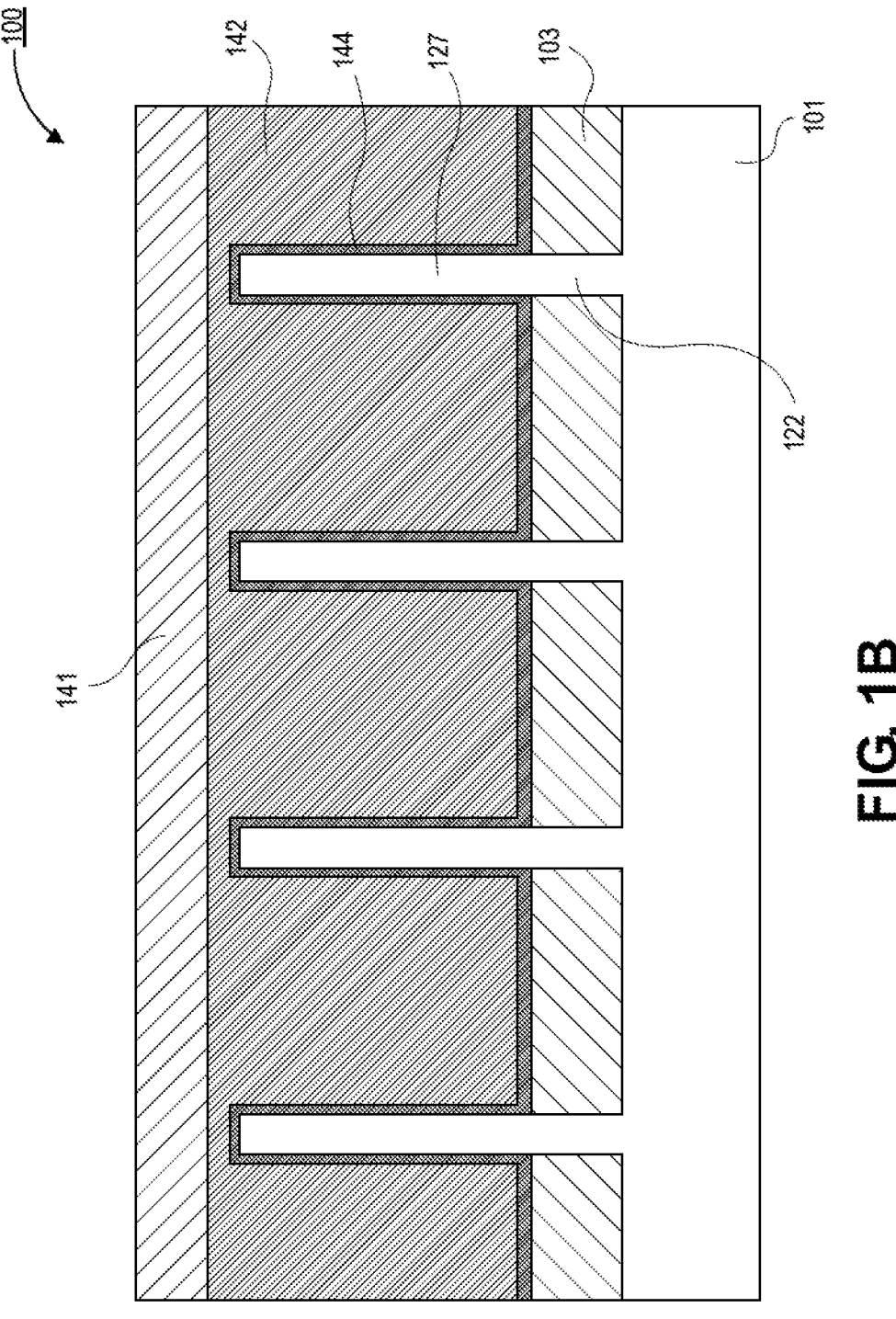
FIG. 1B is a cross-sectional illustration of the transistor device in FIG. 1A with a tri-gate structure, in accordance with an embodiment.

Referring now to FIG. 1B, a cross-sectional illustration of the semiconductor device 100 in FIG. 1A along line B-B is shown, in accordance with an embodiment. As shown, the transistors in FIG. 1A are tri-gate transistors (sometimes called fin-FET devices). In such embodiments, fins 127 may continue up from the sub-fins 122. A gate dielectric 144 may surround three sides of the fins 127 (i.e., the sidewalls and the top surface). The gate metal 142 may surround the fins 127 in order to provide tri-gate control of the semiconductor channels. In an embodiment, the gate metal 142 may comprise a workfunction metal and a fill metal.

In an embodiment, the gate dielectric 144 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

When the gate metal 142 comprises an N-type workfunction metal, the gate metal 142 preferably has a workfunction that is between about 3.9 eV and about 4.2 eV. N-type materials that may be used to form the workfunction metal of the gate metal 142 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal of the gate metal 142 serves as a P-type workfunction metal, the workfunction metal of the gate metal 142 preferable has a workfunction that is between about 4.9 eV and about 5.2 eV. P-type materials that may be used to form the workfunction metal of the gate metal 142 include, but are not limited to, ruthenium, palladium, platinum, cobalt, nickel, and conductive metal oxides, e.g., ruthenium oxide.

Figure 1C:
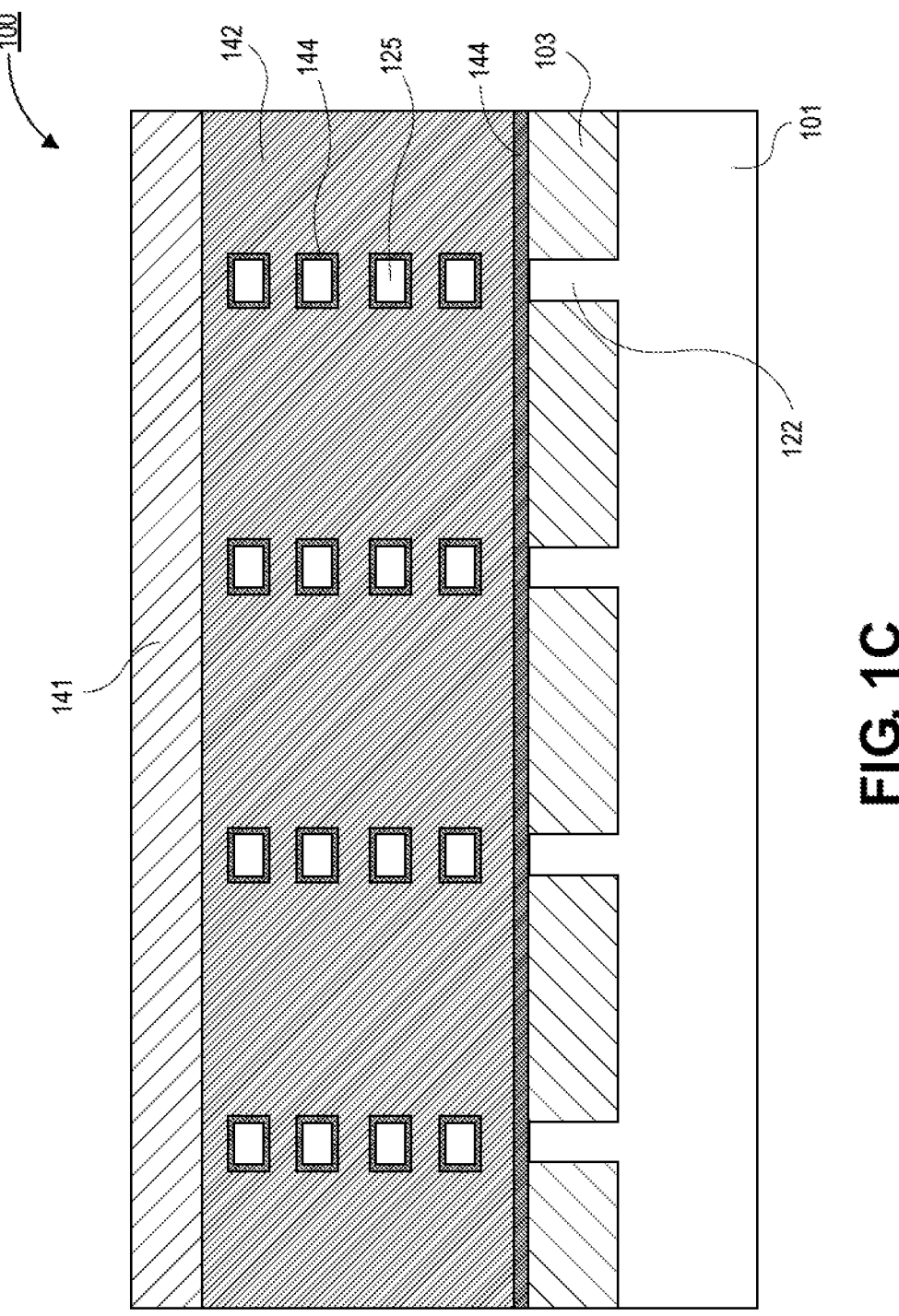
FIG. 1C is a cross-sectional illustration of the transistor device in FIG. 1A with a gate-all-around (GAA) structure, in accordance with an embodiment.

Referring now to FIG. 1C, a cross-sectional illustration of the semiconductor device 100 in FIG. 1A along line B-B is shown, in accordance with an additional embodiment. In the embodiment shown in FIG. 1C, the transistors are gate-all-around (GAA) type transistors (e.g., nanowire, nanoribbon, etc.). As shown, a plurality of semiconductor channels 125 may be aligned over the subfin 122. In an embodiment, the semiconductor channels 125 may be released from the fin by etching away sacrificial layers (not shown). In an embodiment, sacrificial layers may be any material that can be selectively etched with respect to semiconductor channels 125. Semiconductor channels 125 and sacrificial layers may each be a material such as, but not limited to, silicon, germanium, SiGe, GaAs, InSb, GaP, GaSb, InAlAs, InGaAs, GaSbP, GaAsSb, and InP. In a specific embodiment, semiconductor channels 125 are silicon and sacrificial layers are SiGe. In another specific embodiment, semiconductor channels 125 are germanium, and sacrificial layers are SiGe. Fins with alternating semiconductor channels 125 and sacrificial layers may be formed by known methods, such as forming alternating layers of semiconductor channels 125 and sacrificial layers over the substrate 101, and then etching the layers to form a fin-type structure, e.g. with a mask and plasma etch process.

As shown, the semiconductor channels 125 may be surrounded on all sides by the gate dielectric 144. The gate metal 142 may then surround the gate dielectric 144 in order to enable GAA of the semiconductor channels 125. While shown as a single material, it is to be appreciated that the gate metal 142 may comprise a workfunction metal and a fill metal. Materials for the gate dielectric 144 and the gate metal 142 may be substantially similar to the materials described above with respect to FIG. 1B.

Referring now to FIGS. 2A-2F, a series of perspective view illustrations depicting a process for forming a semiconductor device 200 is shown, in accordance with an embodiment. Particularly, the power rail is formed before the source/drain contact formation. This allows for the power rail to be recessed below the gate structure. Embodiments also allow for a self-aligned patterning feature in order to enhance scaling to smaller feature sizes.

Figure 2A:
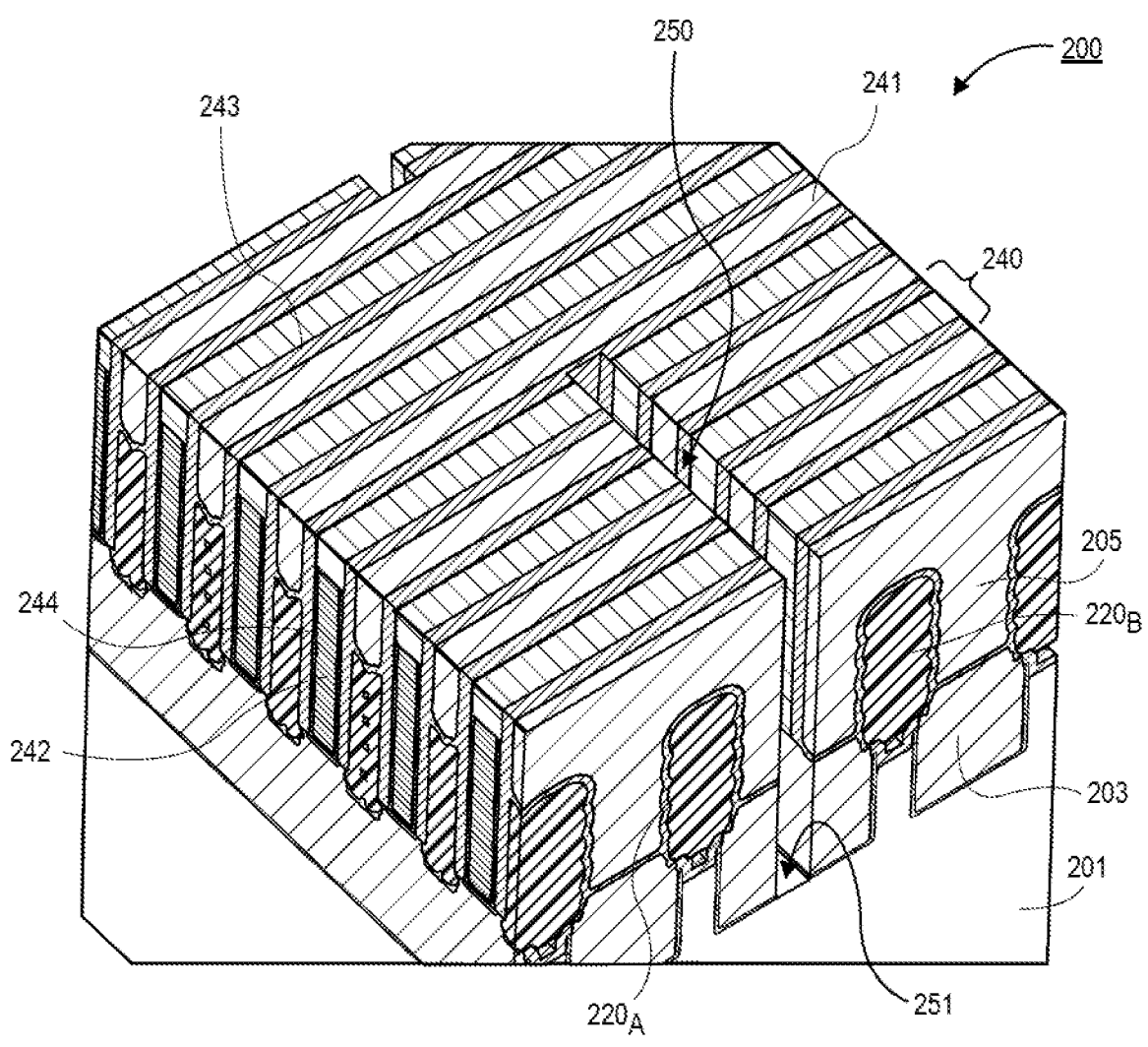
FIGS. 2A-2F are perspective view illustrations depicting a process for forming a buried power rail, in accordance with an embodiment.

Referring now to FIG. 2A, a perspective view illustration of the semiconductor device 200 is shown, in accordance with an embodiment. In an embodiment, the semiconductor device 200 in FIG. 2A may be substantially similar to the semiconductor device 100 illustrated in FIG. 1A. That is, semiconductor structure 200 may comprise a semiconductor substrate 201 on which transistor devices are fabricated. In the illustrated embodiment, source/drains 220 are provided over the isolation layer 203. A second insulating layer 205 may be provided over and around the source/drains 220. A gate structure 240 may be oriented substantially orthogonal to the fins between source/drains 220. The gate structure 240 may comprise spacers 243, a gate dielectric 244, and a gate metal 242. An insulating layer 241 may be provided over a top surface of the gate metal 242. The insulating layer 241 and the second insulating layer 205 may have top surfaces that are substantially coplanar with each other.

As shown in FIG. 2A, a trench 250 is formed between a pair of the source/drains 220. That is, the trench 250 may be provided between a first source/drain 220A and a second source/drain 220B. The trench 250 may extend in a direction that is substantially parallel to the direction of the fins in the semiconductor device 200. In an embodiment, the trench 250 may pass through portions of the gate structure 240. The trench 250 may be formed to a depth that exposes a surface 251 of the underlying semiconductor substrate 201.

Figure 2B:
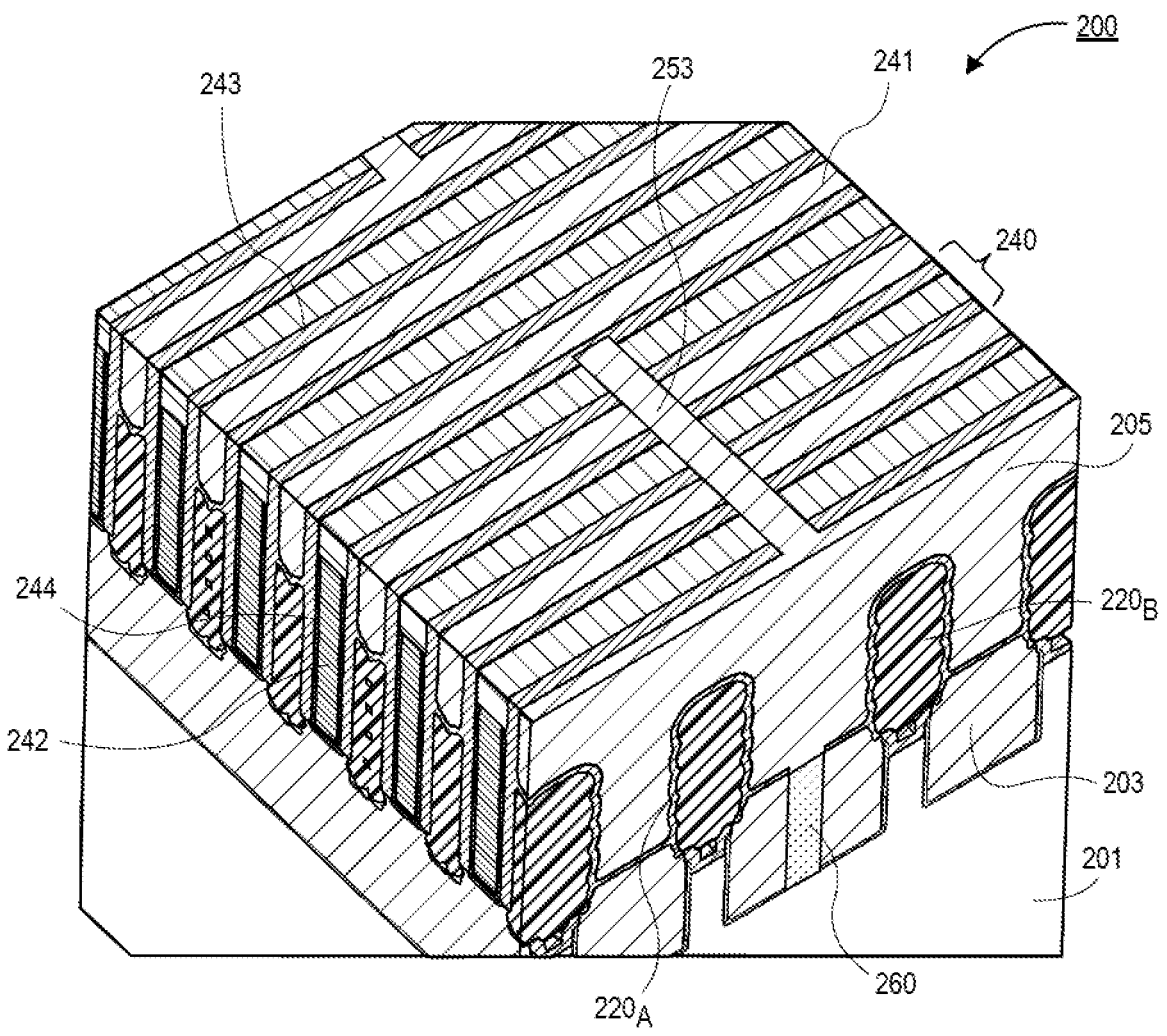

Referring now to FIG. 2B, a perspective view illustration of the semiconductor device 200 is shown, in accordance with an embodiment. As shown, a power rail 260 may be formed at a bottom of the trench 250. The power rail 260 may extend into the semiconductor substrate along the entire length of the trench 250. The power rail 260 may comprise a conductive material. For example, the power rail 260 may comprise tungsten or the like. The power rail 260 may be formed by blanket depositing the conductive material. The conductive material may be polished to have a top surface substantially coplanar with the top surface of the insulating layer 205. The conductive material may then be recessed (e.g., with an etching process) until the power rail 260 within the trench is at a desired height. For example, the power rail 260 may have a height that is substantially similar to a height of the isolation layer 203. Though, it is to be appreciated that the height of the power rail 260 may be less than or greater than the height of the isolation layer 203 in various embodiments. Generally, the top surface of the power rail 260 is below the top surface of the gate structure 240. In some embodiments, the top surface of the power rail 260 is below a bottom surface of the gate structure 240.

In the illustrated embodiment, the power rail 260 is in direct contact with the isolation layer 203. However, in other embodiments, a liner may surround the bottom surface and the sidewall surfaces of the power rail 260. For example, the liner may comprise silicon and oxygen (e.g., SiO$_2$). After the power rail 260 is formed, an insulating layer 253 may be deposited into the trench 250. The insulating layer 253 may be a material that is similar or the same as the insulating layer 205 and/or the isolation layer 203.

Figure 2C:
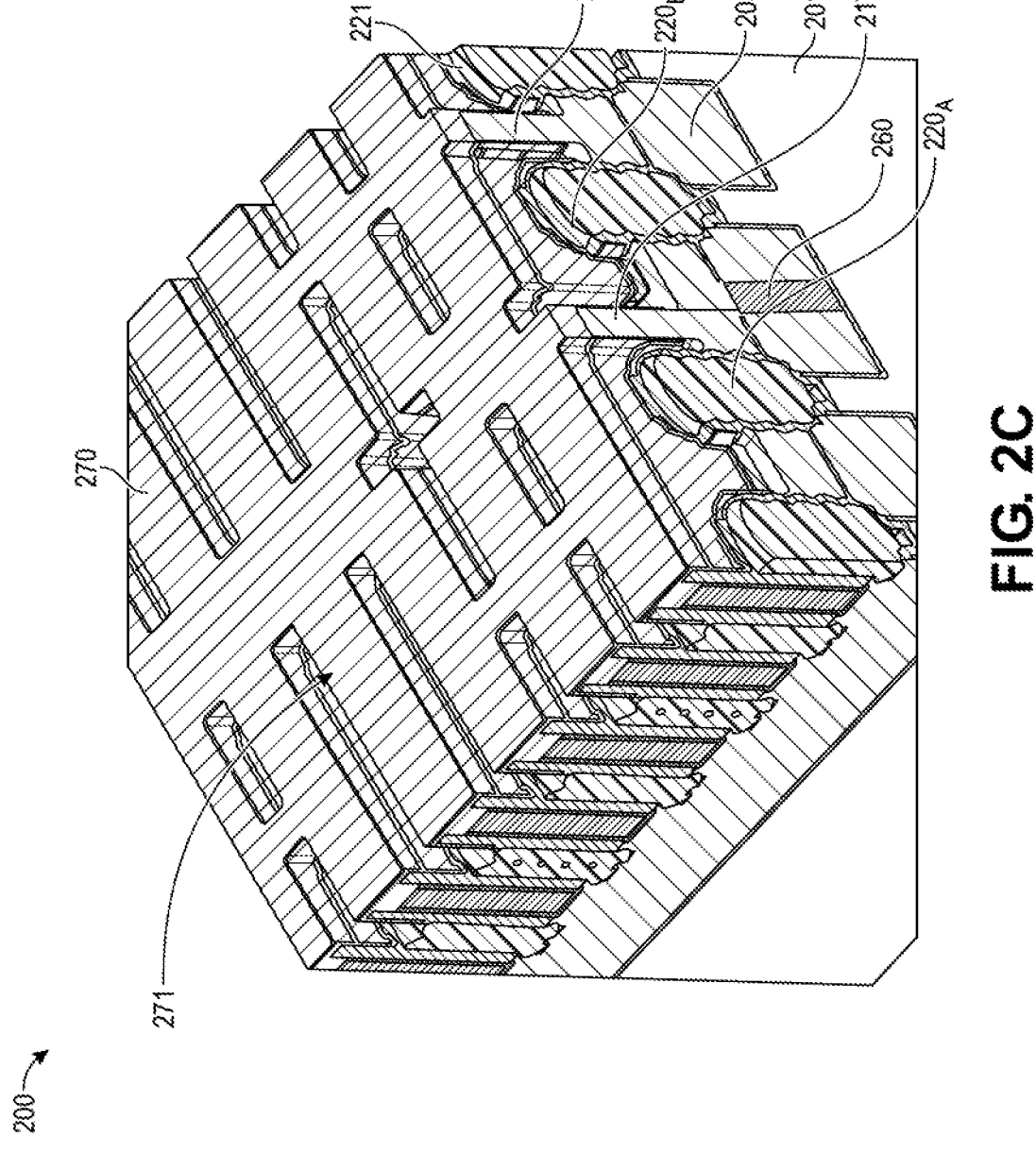

Referring now to FIG. 2C, a perspective view illustration of the semiconductor device 200 after source/drain contact openings 271 are formed is shown, in accordance with an embodiment. In an embodiment, the contact openings 271 may be formed through an insulating layer 270 disposed over the top surfaces of the semiconductor device 200. In an embodiment, the contact openings 271 expose the source/drains 220. In the particular embodiment shown in FIG. 2C, a contact opening 271 may be formed over the first source/drain 220A, and a separate contact opening 271 may be formed over the second source drain 220B. As shown, a ridge 217 remains in the second insulating layer 205 to separate the two contact openings 271. In an embodiment, an interface layer 221 may be disposed over the surfaces of the source/drains 220. For example, the interface layer 221 may comprise titanium.

Figure 2D:
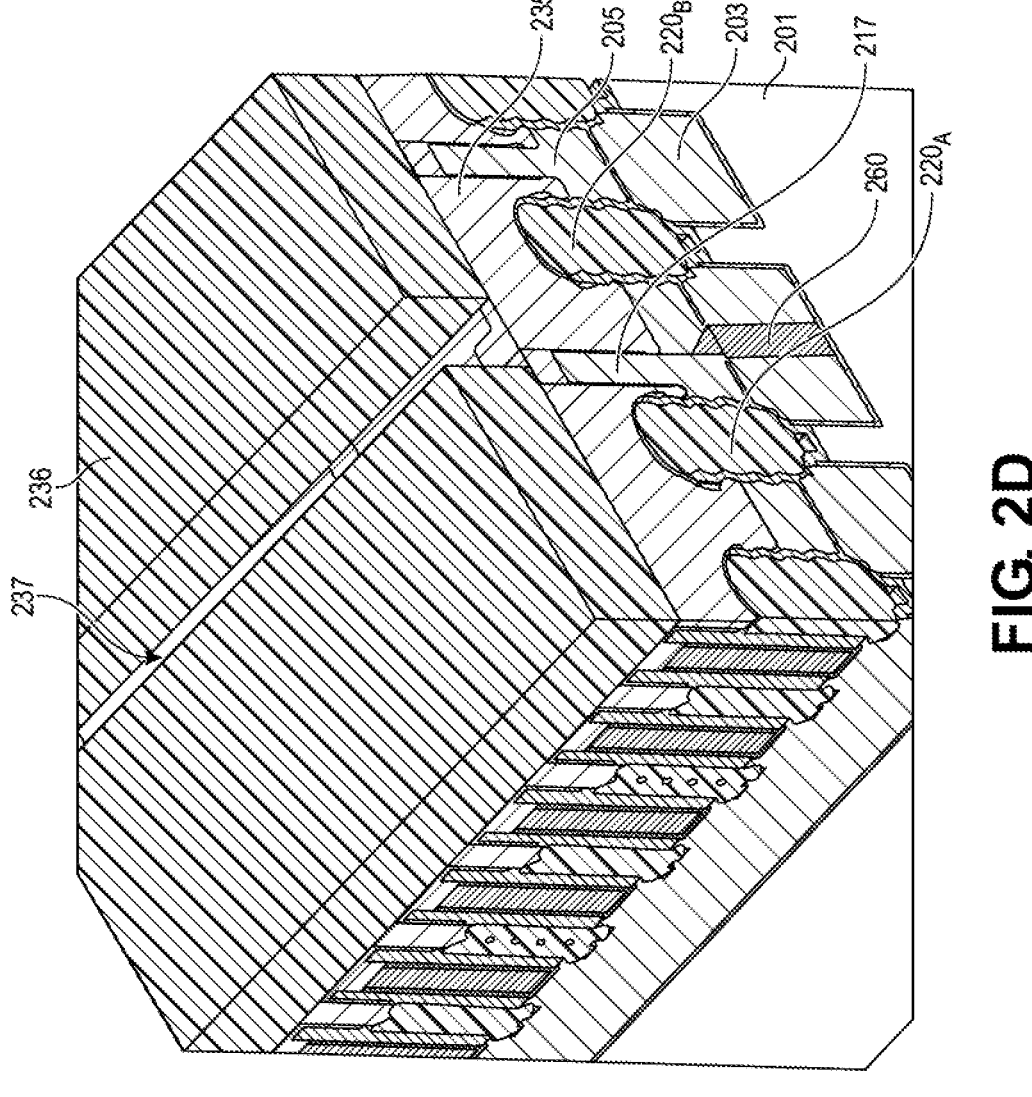

Referring now to FIG. 2D, a perspective view illustration of the semiconductor device 200 after a grating 236 is formed is shown, in accordance with an embodiment. Before the grating 236 is formed, a sacrificial material 235 may be disposed in the contact openings 271. The sacrificial material 235 may be a material that is etch selective to the insulating layer 270. The sacrificial material 235 may be deposited and polished back to have a top surface that is substantially coplanar with a top surface of the insulating layer 270. After the sacrificial material 235 is deposited, a grating 236 is formed over the top surfaces. The grating 236 may have an opening 237. The opening 237 may run substantially over the buried power rail 260. The grating 236 exposes a portion of the sacrificial material 235 that is over the power rail 260.

Figure 2E:
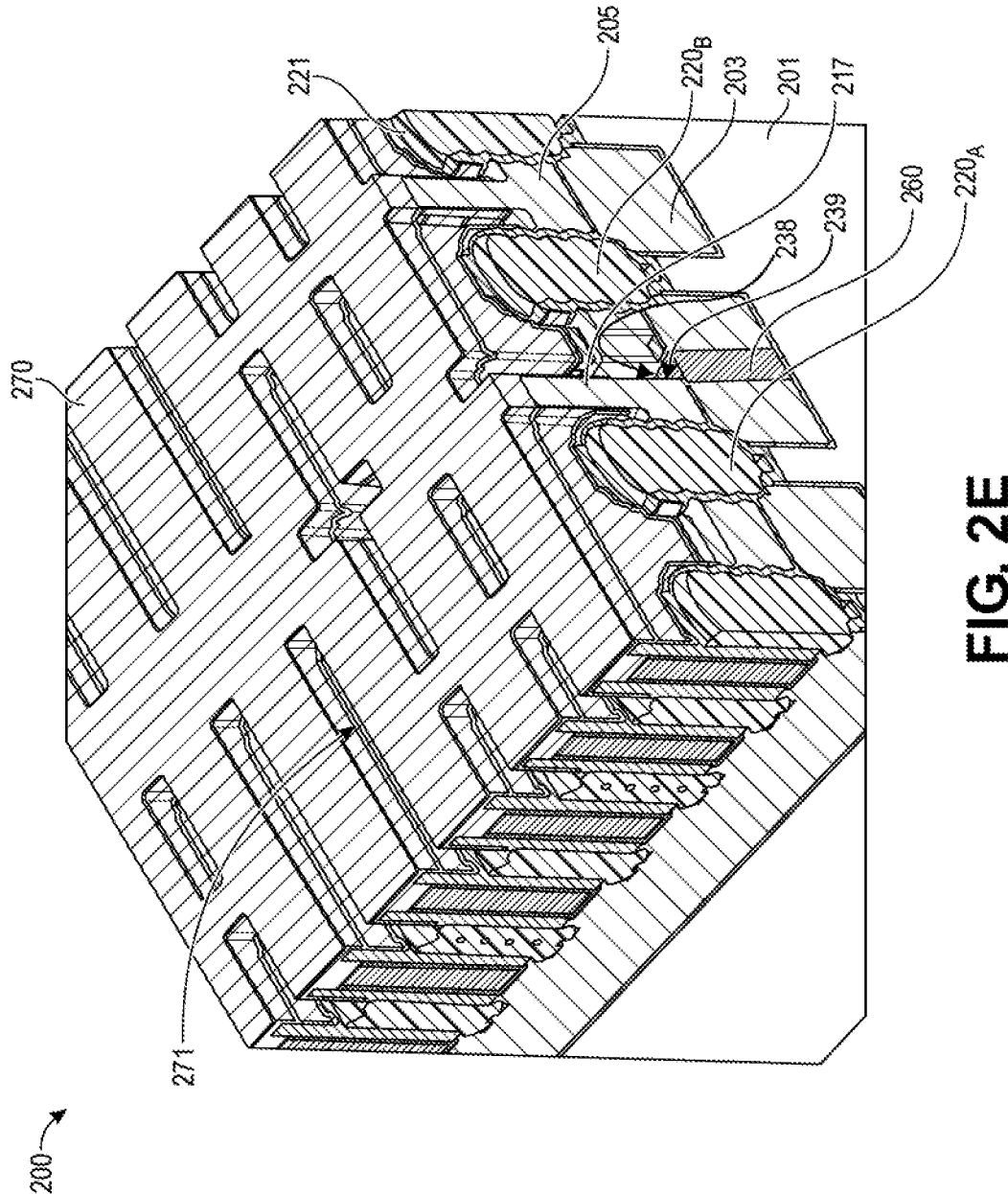

Referring now to FIG. 2E, a perspective view illustration of the semiconductor device 200 after an etching process is implemented is shown, in accordance with an embodiment. The etching process uses the grating 236 as a mask and removes portions of the sacrificial material 235. After the sacrificial material 235 is removed, portions of the insulating layer 205 are exposed and subsequently etched as well. As shown in FIG. 2E, the etching process removes a portion of the insulating layer 205 above the power rail 260. The removal of the insulating layer 205 results in the formation of recess 238. The ridge 217 also serves as a masking layer during the etching process. Accordingly, an edge 239 of the recess 238 is substantially aligned with the ridge 217. This operation can be referred to as being a self-aligned etch since the etching relies on an existing structure and not a lithographically defined mask. As used herein, substantially aligned may refer to two surfaces that are within 5 nm of being perfectly aligned. That is, process variations and tolerances may result in two surfaces being slightly misaligned, even when a self-aligned process is used.

Figure 2F:
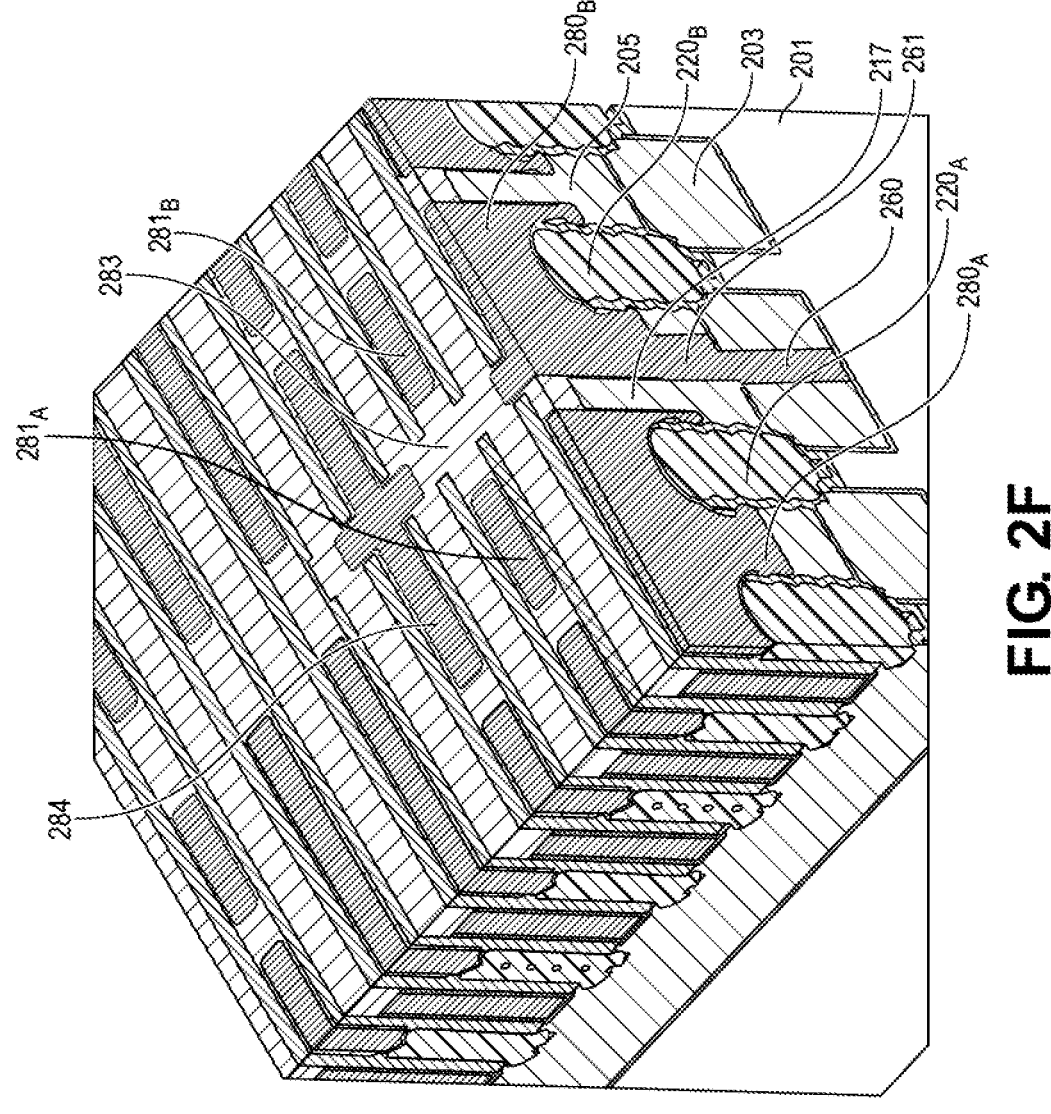

Referring now to FIG. 2F, a perspective view illustration of the semiconductor device 200 after the source/drain contacts 280 are formed is shown, in accordance with an embodiment. In an embodiment, the buried power rail 260 may be coupled to the second source/drain contact 280B by a via 261. The via 261 may fill the recess 238 formed in FIG. 2E. The source/drain contact 280A may be separated from the source/drain contact 280B by the ridge 217. In an embodiment, the power rail 260 may extend into the structure and couple with the source/drain contact 284. That is, the power rail 260 passes past the source/drain contacts 281A and 281B. Particularly, the power rail 260 passes below a contact plug 283 between the source/drain contacts 281A and 281B. Accordingly, the source/drain 220B may be electrically coupled to the source/drain (not shown) below the source/drain contact 284.

Figure 3A:
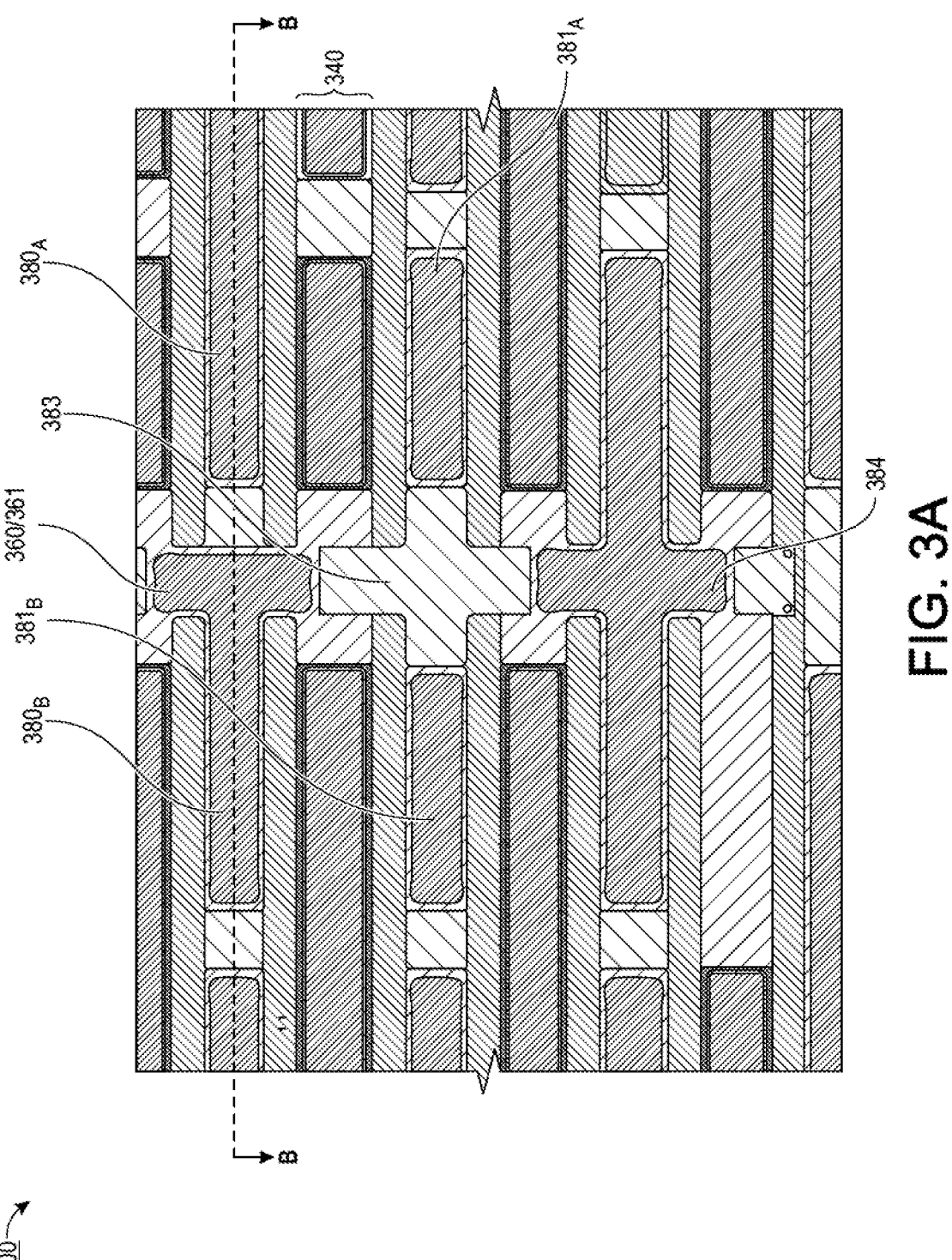
FIG. 3A is a plan view illustration of the transistor device fabricated in FIGS. 2A-2F, in accordance with an embodiment.

Referring now to FIG. 3A, a plan view illustration of a semiconductor device 300 after the source/drain contacts 380/381/384 are formed is shown, in accordance with an embodiment. In an embodiment, gate structures 340 may be provided between rows of source/drain contacts 380/381/384. For example, the labeled gate structure 340 is between source/drain contacts 380A-B and source/drain contacts 381A-B. In an embodiment, the source/drain contact 380B may have a T-shape, with the buried power rail 360 and the via 361 (which are both below source/drain contact 380B) being located in the cross member of the T-shape. The buried power rail 360 extends below the source/drain plug 383 until it reaches the source/drain contact 384. A via similar to via 361 may connect the power rail 360 to the source/drain contact 384. As such, the source/drain contact 380B may be electrically coupled to the source/drain contact 384 by the buried power rail 360.

Figure 3B:
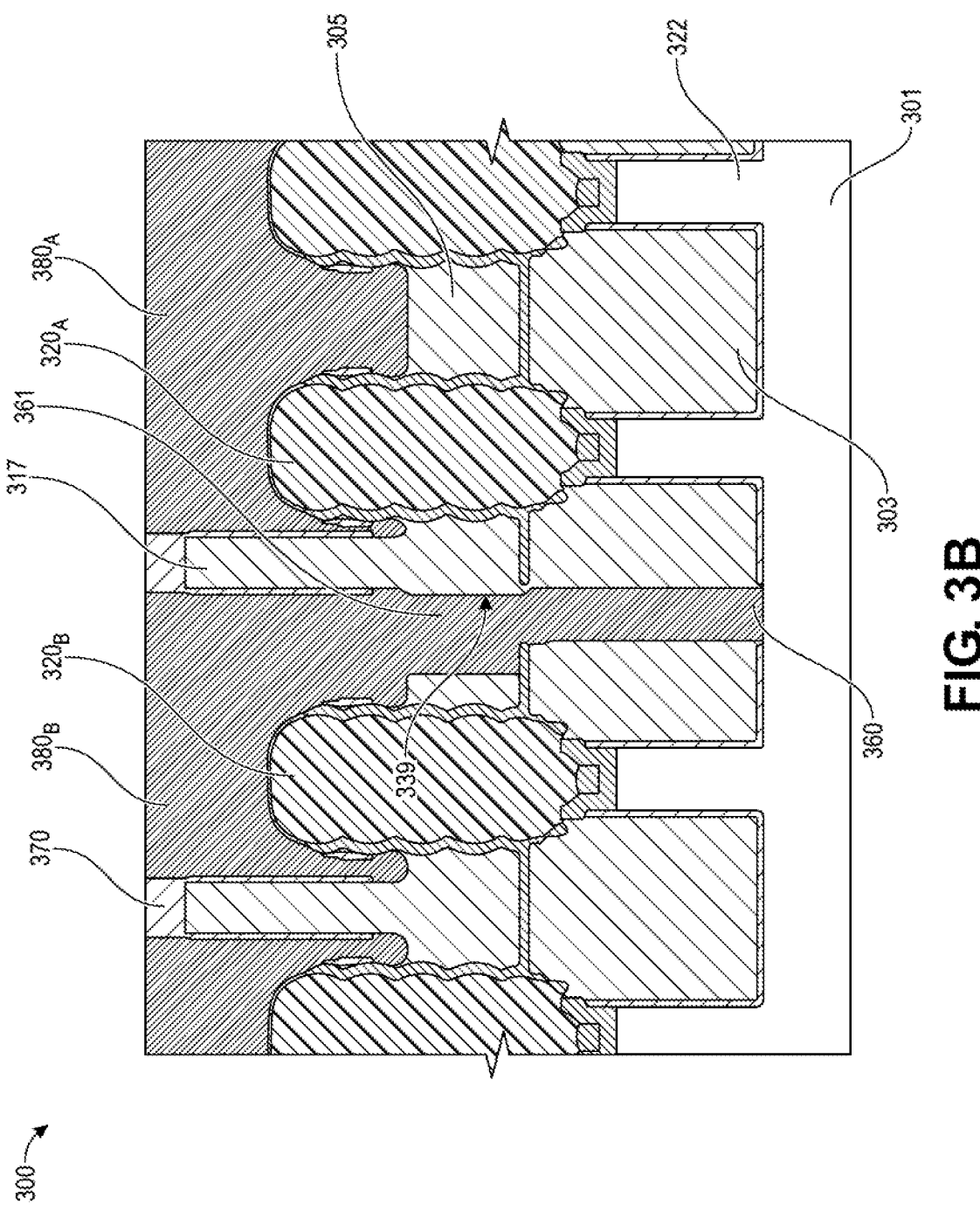
FIG. 3B is a cross-sectional illustration of the transistor device in FIG. 3A, in accordance with an embodiment.

Referring now to FIG. 3B, a cross-sectional illustration of the semiconductor device 300 along line B-B in FIG. 3A is shown, in accordance with an embodiment. In an embodiment, source/drains 320A and 320B are over subfins 322 that extend up from the substrate 301. An isolation layer 303 is around the subfins 322. An additional insulating layer 305 is provided above the isolation layer 303. As shown, the power rail 360 is positioned in the isolation layer 303 between source/drains 320A and 320B. A via 361 couples the power rail 360 to the source/drain contact 380B. In an embodiment, an edge 339 of the via 361 is aligned with the ridge 317 that separates the source/drain contact 380A from the source/drain contact 380B. A portion of an insulating layer 370 may be provided over the top surface of the ridge 317.

Figure 4:
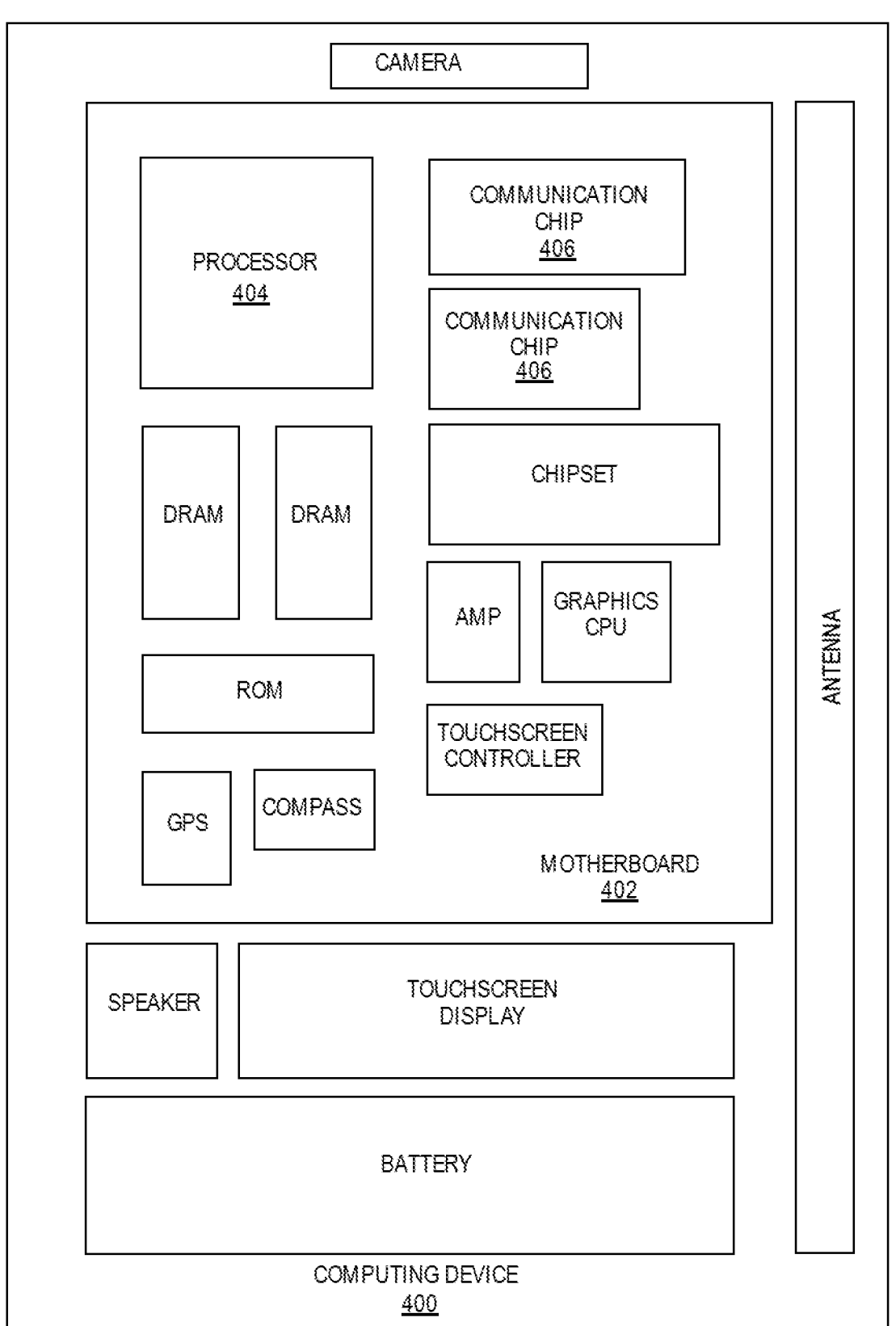
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In an embodiment, the integrated circuit die of the processor may comprise non-planar transistor devices with a buried power rail that is coupled to a source/drain contact by a self-aligned vias, as described herein. The term "processor"

may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip may comprise non-planar transistor devices with a buried power rail that is coupled to a source/drain contact by a self-aligned vias, as described herein.

In further implementations, another component housed within the computing device 400 may comprise non-planar transistor devices with a buried power rail that is coupled to a source/drain contact by a self-aligned vias, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
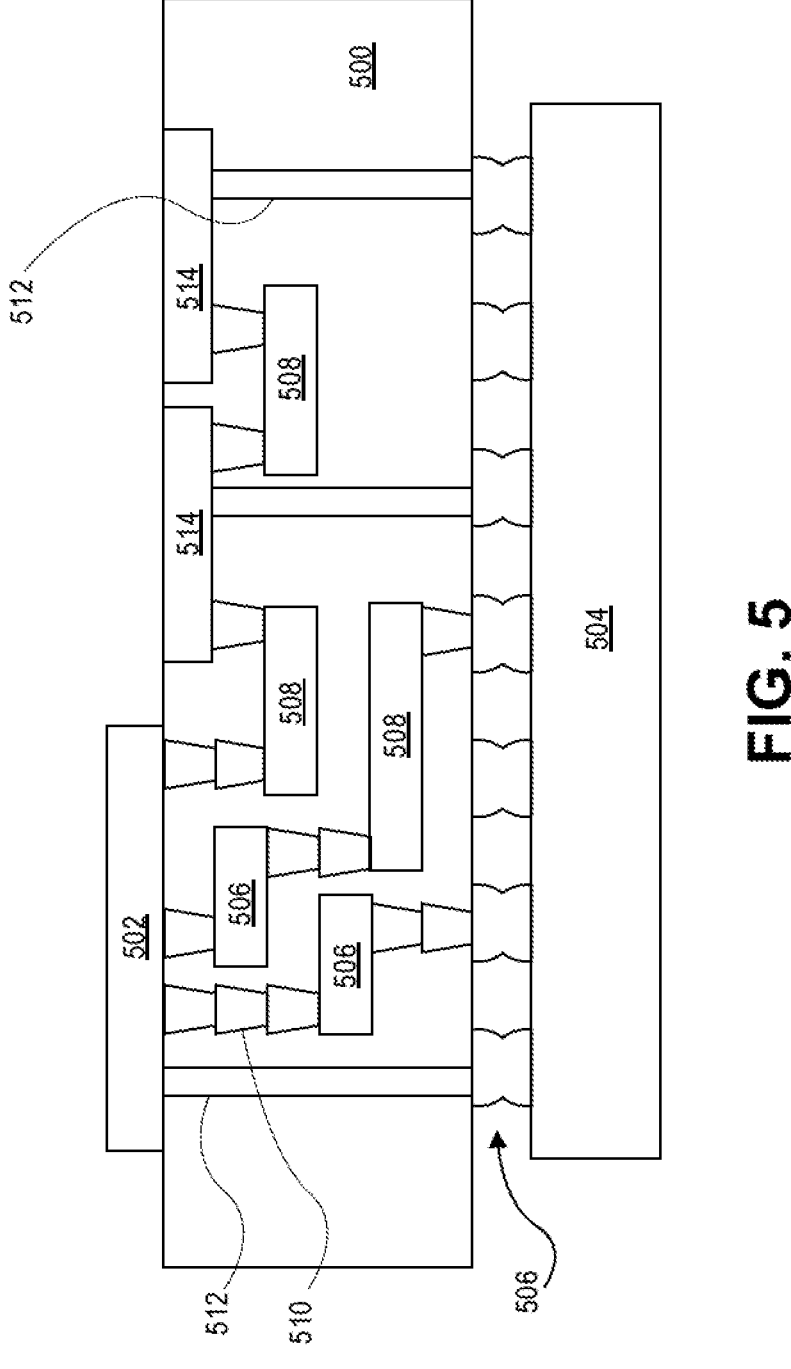
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. In an embodiment, one of both of the first substrate 502 and the second substrate 504 may comprise non-planar transistor devices with a buried power rail that is coupled to a source/drain contact by a self-aligned vias, in accordance with embodiments described herein. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure may comprise non-planar transistor devices with a buried power rail that is coupled to a source/drain contact by a self-aligned vias.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a first non-planar transistor over a substrate; a second non-planar transistor over the substrate and parallel to the first non-planar transistor; a gate structure over the first non-planar transistor and the second non-planar transistor; and a power rail between the first non-planar transistor and the second non-planar transistor, wherein a top surface of the power rail is below a top surface of a gate structure.

Example 2: the semiconductor device of Example 1, wherein the top surface of the power rail is below a bottom surface of the gate structure.

Example 3: the semiconductor device of Example 1 or Example 2, wherein an edge of the power rail is aligned with an edge of a source contact of the first non-planar transistor.

Example 4: the semiconductor device of Example 3, wherein a dielectric ridge is provided between the source contact of the first non-planar transistor and a source contact of the second non-planar transistor.

Example 5: the semiconductor device of Example 4, wherein an edge of the ridge is substantially aligned with the edge of the power rail.

Example 6: the semiconductor device of Examples 1-5, wherein the power rail is at least partially surrounded by a dielectric liner.

Example 7: the semiconductor device of Example 6, wherein the dielectric liner comprises silicon and oxygen.

Example 8: the semiconductor device of Examples 1-7, further comprising: a cut through the gate structure located directly above the power rail.

Example 9: the semiconductor device of Examples 1-8, wherein the power rail passes under a contact plug between a source or drain of the first transistor and a source or drain of the second transistor.

Example 10: the semiconductor device of Example 9, wherein the power rail electrically couples the first transistor to a third transistor.

Example 11: the semiconductor device of Examples 1-10, wherein the first transistor and the second transistor are tri-gate devices.

Example 12: the semiconductor device of Examples 1-11, wherein the first transistor and the second transistor are gate-all-around (GAA) devices.

Example 13: a method of forming a semiconductor device comprising: providing a first non-planar transistor and a second non-planar transistor adjacent to the first non-planar transistor; forming a trench between the first non-planar transistor and the second non-planar transistor; filling the trench with a metal; recessing the metal to form a buried power rail, wherein a top surface of the buried power rail is below a top surface of a gate structure across the first non-planar transistor and the second non-planar transistor; filling the remainder of the trench with a dielectric; forming contact openings over ends of the first non-planar transistor and the second non-planar transistor; filling the contact openings with a mask layer; etching the mask layer above the buried power rail to expos the buried power rail; removing the mask layer; and disposing a contact metal in the contact openings, wherein a contact metal for the first non-planar transistor contacts the buried power rail.

Example 14: the method of Example 13, further comprising: lining the trench with a liner before depositing the metal.

Example 15: the method of Example 14, wherein the liner comprises silicon and oxygen.

Example 16: the method of Examples 13-15, wherein the metal comprises tungsten.

Example 17: the method of Examples 13-16, wherein forming contact openings results in the formation of a dielectric ridge between the first non-planar transistor and the second non-planar transistor.

Example 18: the method of Example 17, wherein etching the mask layer above the buried power rail is a self-aligned process using the dielectric ridge as a masking layer.

Example 19: the method of Examples 13-18, wherein the trench passes through the gate structure.

Example 20: the method of Examples 13-18, wherein the buried power rail passes below a plug between contacts of the first non-planar transistor and the second non-planar transistor.

Example 21: the method of Examples 13-20, wherein the first non-planar transistor and the second non-planar transistor are tri-gate devices.

Example 22: the method of Examples 13-21, wherein the first non-planar transistor and the second non-planar transistor are gate-all-around (GAA) devices.

Example 23: an electronic system, comprising: a board; a package substrate coupled to the board; and a die coupled to the package substrate, wherein the die comprises: a first non-planar transistor over a substrate; a second non-planar transistor over the substrate and parallel to the first non-planar transistor; a gate structure over the first non-planar transistor and the second non-planar transistor; and a power rail between the first non-planar transistor and the second non-planar transistor, wherein a top surface of the power rail is below a top surface of a gate structure.

Example 24: the electronic system of Example 23, wherein an edge of the power rail is aligned with an edge of a source contact of the first non-planar transistor.

Example 25: the electronic system of Example 24, wherein a dielectric ridge is provided between the source contact of the first non-planar transistor and a source contact of the second non-planar transistor.

What is claimed is:

1. A semiconductor device, comprising:
    a first non-planar transistor over a substrate;
    a second non-planar transistor over the substrate and parallel to the first non-planar transistor;
    a gate structure over the first non-planar transistor and the second non-planar transistor; and
    a power rail in a trench isolation structure between the first non-planar transistor and the second non-planar transistor, wherein a top surface of the power rail is below a top surface of a gate structure, and wherein a bottom surface of the power rail is at a same level as a bottom surface of the trench isolation structure.

2. The semiconductor device of claim 1, wherein the top surface of the power rail is below a bottom surface of the gate structure.

3. The semiconductor device of claim 1, wherein an edge of the power rail is aligned with an edge of a source contact of the first non-planar transistor.

4. The semiconductor device of claim 3, wherein a dielectric ridge is provided between the source contact of the first non-planar transistor and a source contact of the second non-planar transistor.

5. The semiconductor device of claim 4, wherein an edge of the ridge is substantially aligned with the edge of the power rail.

6. The semiconductor device of claim 1, wherein the power rail is at least partially surrounded by a dielectric liner.

7. The semiconductor device of claim 6, wherein the dielectric liner comprises silicon and oxygen.

8. The semiconductor device of claim 1, further comprising:

a cut through the gate structure located directly above the power rail.

9. The semiconductor device of claim 1, wherein the power rail passes under a contact plug between a source or drain of the first transistor and a source or drain of the second transistor.

10. The semiconductor device of claim 9, wherein the power rail electrically couples the first transistor to a third transistor.

11. The semiconductor device of claim 1, wherein the first transistor and the second transistor are tri-gate devices.

12. The semiconductor device of claim 1, wherein the first transistor and the second transistor are gate-all-around (GAA) devices.

13. A method of forming a semiconductor device comprising:

providing a first non-planar transistor and a second non-planar transistor adjacent to the first non-planar transistor;

forming a trench in a trench isolation structure between the first non-planar transistor and the second non-planar transistor;

filling the trench with a metal;

recessing the metal to form a buried power rail, wherein a top surface of the buried power rail is below a top surface of a gate structure across the first non-planar transistor and the second non-planar transistor, and wherein a bottom surface of the power rail is at a same level as a bottom surface of the trench isolation structure;

filling the remainder of the trench with a dielectric;

forming contact openings over ends of the first non-planar transistor and the second non-planar transistor;

filling the contact openings with a mask layer;

etching the mask layer above the buried power rail to expos the buried power rail;

removing the mask layer; and disposing a contact metal in the contact openings, wherein a contact metal for the first non-planar transistor contacts the buried power rail.

14. The method of claim 13, further comprising:

lining the trench with a liner before depositing the metal.

15. The method of claim 14, wherein the liner comprises silicon and oxygen.

16. The method of claim 13, wherein the metal comprises tungsten.

17. The method of claim 13, wherein forming contact openings results in the formation of a dielectric ridge between the first non-planar transistor and the second non-planar transistor.

18. The method of claim 17, wherein etching the mask layer above the buried power rail is a self-aligned process using the dielectric ridge as a masking layer.

19. The method of claim 13, wherein the trench passes through the gate structure.

20. The method of claim 13, wherein the buried power rail passes below a plug between contacts of the first non-planar transistor and the second non-planar transistor.

21. The method of claim 13, wherein the first non-planar transistor and the second non-planar transistor are tri-gate devices.

22. The method of claim 13, wherein the first non-planar transistor and the second non-planar transistor are gate-all-around (GAA) devices.

23. An electronic system, comprising:

a board;

a package substrate coupled to the board; and a die coupled to the package substrate, wherein the die comprises:

a first non-planar transistor over a substrate;

a second non-planar transistor over the substrate and parallel to the first non-planar transistor;

a gate structure over the first non-planar transistor and the second non-planar transistor; and a power rail in a trench isolation structure between the first non-planar transistor and the second non-planar transistor, wherein a top surface of the power rail is below a top surface of a gate structure, and wherein a bottom surface of the power rail is at a same level as a bottom surface of the trench isolation structure.

24. The electronic system of claim 23, wherein an edge of the power rail is aligned with an edge of a source contact of the first non-planar transistor.

25. The electronic system of claim 24, wherein a dielectric ridge is provided between the source contact of the first non-planar transistor and a source contact of the second non-planar transistor.

* * * * *